United States Patent [19]
Onishi et al.

[11] Patent Number: 5,416,735
[45] Date of Patent: May 16, 1995

[54] NON-VOLATILE RANDOM ACCESS MEMORY WITH FERROELECTRIC CAPACITOR

[75] Inventors: Shigeo Onishi, Nara; Kenichi Tanaka, Fukuyama; Keizo Sakiyama, Kashihara, all of Japan

[73] Assignee: Sharp Kabushiki Kaisha, Osaka, Japan

[21] Appl. No.: 200,552

[22] Filed: Feb. 22, 1994

Related U.S. Application Data

[63] Continuation of Ser. No. 907,136, Jul. 1, 1992, abandoned.

[30] Foreign Application Priority Data

Jul. 2, 1991 [JP] Japan .................. 3-161736

[51] Int. Cl.$^6$ .................. H01L 27/11; H01L 29/772; H01L 29/92; G11C 11/22
[52] U.S. Cl. ...................... 365/145; 365/65; 257/295; 257/298
[58] Field of Search ............. 257/295, 298; 365/145, 365/149, 65

[56] References Cited

U.S. PATENT DOCUMENTS

| | | | |
|---|---|---|---|
| 5,075,888 | 12/1991 | Yamauchi et al. | 257/298 |
| 5,121,353 | 6/1992 | Natori | 257/295 |
| 5,187,638 | 2/1993 | Sandhu et al. | 257/295 |
| 5,198,994 | 3/1993 | Natori | 365/145 |

*Primary Examiner*—Jerome Jackson
*Attorney, Agent, or Firm*—Nixon & Vanderhye

[57] ABSTRACT

Random access memory includes a pair of metal oxide semiconductor (MOS) transistors which are connected to each other by a common impurity diffusion region, and a capacitor which is formed of ferroelectric film acting as a capacitor layer and is connected to the impurity diffusion region, one of the pair of MOS transistors being connected to a bit line and a word line.

2 Claims, 7 Drawing Sheets

NON-VOLATILE RANDOM ACCESS MEMORY WITH FERROELECTRIC CAPACITOR

This is a continuation of application Ser. No. 07/907,136, filed Jul. 1, 1992, now abandoned.

BACKGROUND OF THE INVENTION

1. Field of the Invention

The present invention relates to a non-volatile random access memory, and more specifically, it relates to a non-volatile random access memory (FRAM) for which ferroelectric film is employed.

2. Description of the Related Art

As typical random access memory devices, a static RAM (SRAM) and a dynamic RAM (DRAM) are well-known. Both of them are disadvantageous in that they are volatile memories, and that the former is limited in large-scale integration because it requires six transistors per a single memory cell, while the latter has to have its capacitor periodically refreshed to retain data.

In recent years, as a non-volatile random access memory device, a ferroelectric RAM (FRAM) where ferroelectric film is utilized for capacitors has become known in the art.

Figure 5:
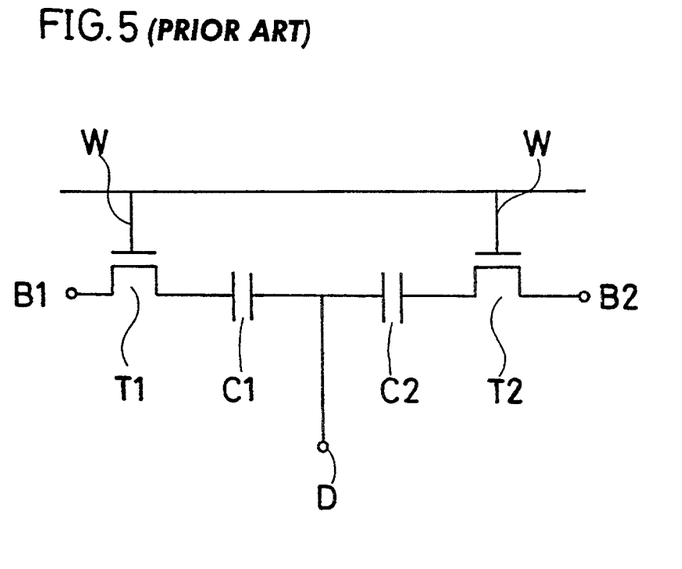
FIG. 5 is a diagram showing a configuration of a basic circuit of a conventional FRAM.

A circuit configuration of such a typical FRAM is shown in FIG. 5. As can be seen, the FRAM has a single memory cell essentially consisting of two transistors and two capacitor elements. In FIG. 5, there are shown MOS transistors, T1 and T2, ferroelectric film capacitor elements, C1 and C2, a drive line D, a word line W, and bit lines, B1 and B2.

In such a FRAM, setting the drive line at high voltage or ground voltage with one of the bit lines set at high voltage and the other at the ground voltage, polarization occurs in one of the capacitor elements, and thereby writing is performed in the memory. Meanwhile, applying high voltage to the drive line with both of the bit lines set at ground potential, a potential difference arises between either of the bit lines and either of the capacitor elements, and the potential difference is detected by a sense amplifier to perform reading.

Such a conventional FRAM requires two transistors and two capacitors per a single memory cell, as mentioned above, and with respect to a further increase in memory capacity and higher integration, it is desirable, to simplify the a configuration of the device.

SUMMARY OF THE INVENTION

According to the present invention, a non-volatile random access memory is formed of a pair of metal oxide semiconductor (MOS) transistors which are connected to each other by a common impurity diffusion region, and a capacitor having a ferroelectric film acting as a capacitor dielectric layer wherein the capacitor is connected to the impurity diffusion region, and one of the pair of MOS transistor elements is connected to a bit line and a word line.

Preferably, the ferroelectric film is a lead zirconate titanate (PZT: $Pb(Zr_xTi_{1-x})O_3$) film.

DETAILED DESCRIPTION OF THE INVENTION

Figure 1:
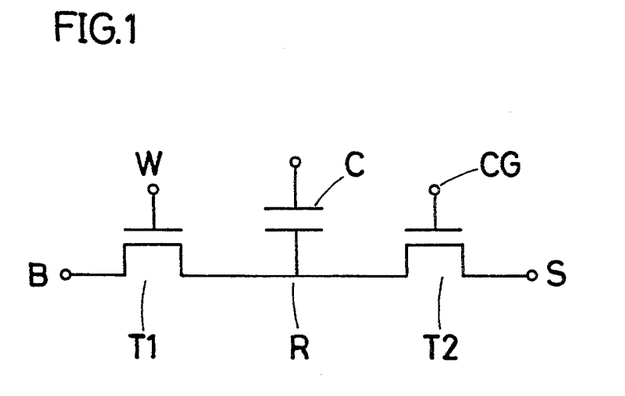
FIG. 1 is a diagram showing a configuration of a basic circuit of a non-volalile RAM according to the present invention.

A configuration of a basic circuit of a single cell of a FRAM according to the present invention is shown in FIG. 1. The FRAM of the present invention consists of a transistor T1 connected to a bit line B and a word line W, a transistor T2 including a control gate CG and a source line S, and a capacitor C formed of ferroelectric film, and these elements are all connected to one another by an impurity diffusion region R.

Reading and writing operations in such a FRAM are performed by applying voltage and, switching among high voltage, low voltage and zero voltage, to the bit line for one of the MOS transistors, and the operations are also performed under control of voltage applying means which can apply low voltage as a bias to the capacitor and a source voltage to the other MOS transistor.

Figure 2:
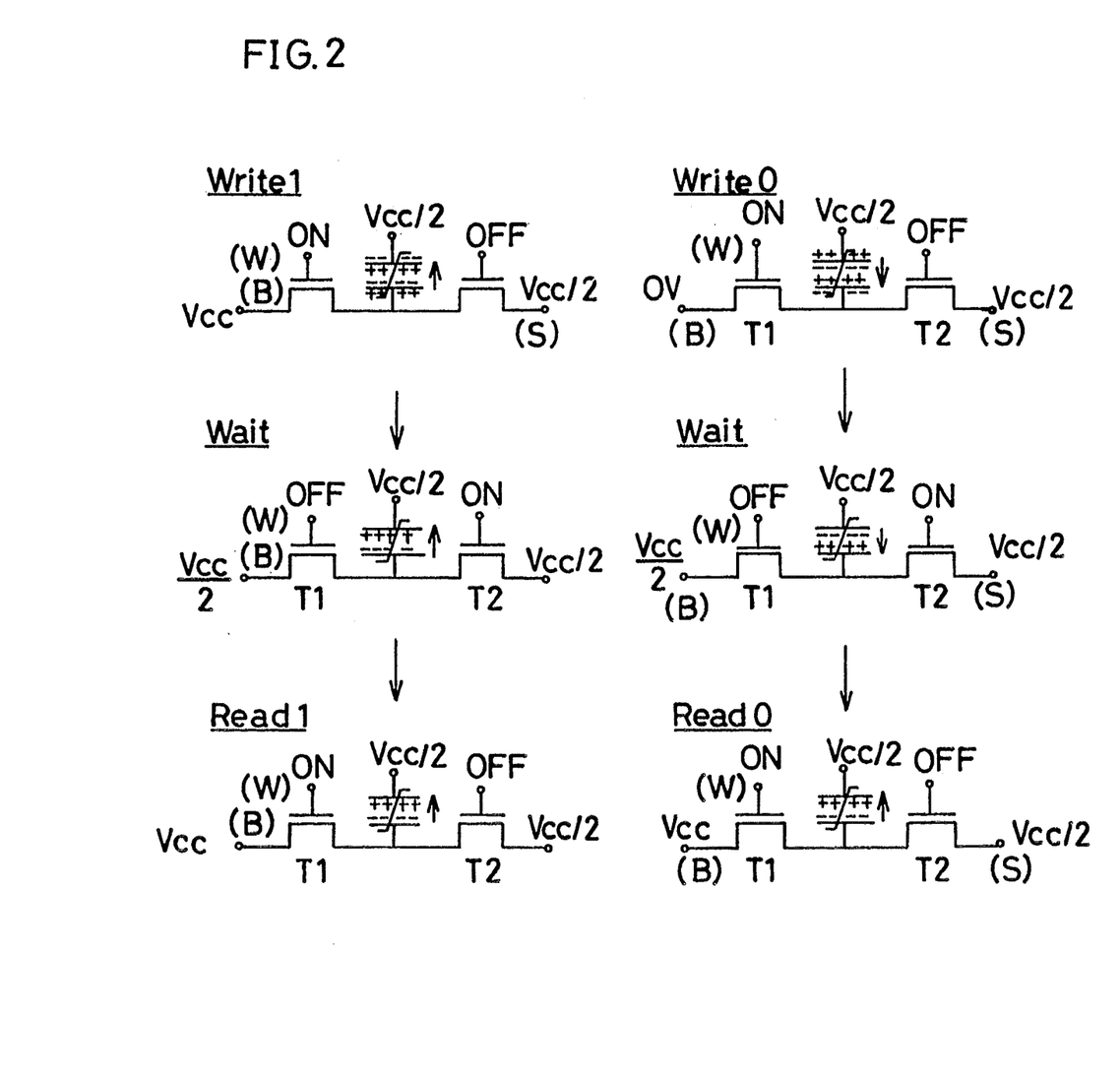
FIG. 2 is a diagram for explaining the operation, using diagrams of the basic circuit of the non-volatile RAM.

With reference to FIG. 2, the operation of the FRAM will be explained.

Writing Operation (Write "1" or Write "0")

A potential at an upper side (cell plate) of the capacitor C and a potential at the source are fixed at Vcc/2 (low voltage). In the event of a Write "1" operation, a potential at the bit line B is fixed at Vcc (high voltage), and an access is made to the word line W. At this time, electric charge +Qr is accumulated at the cell plate. On the other hand, in the event of Write "0", the potential at the bit line B is fixed at 0 V, and an access is made to the word line W. At this time, electric charge −Qr is accumulated at the cell plate. Even with turning a power source off in such circumstances, residual charge ±Qr is still accumulated in the capacitor, and thus, the FRAM serves as a non-volatile memory.

Reading Operation (Read "1" or Read "0")

The potential at the cell plate and the potential at the source are fixed at Vcc/2. The potential at the bit line B is fixed at Vcc, and an access is made to the word line W.

In the event of Read "1", no polarization reversal of the capacitor arises. Hence, no potential difference from that at a dummy cell is developed on the bit line B. In the event of Read "0", polarization reversal arises in the capacitor, a polarization potential difference $\delta V = 2Qr/C_B$ (where Qr is a residual polarization, and $C_B$ is a bit line capacity) is developed on the bit line B (potential difference from that at the dummy cell) and is output as a signal from the sense amplifier.

Status "Wait"

During a status "wait", respective potentials at the cell plate, the bit line B and the source are fixed at Vcc/2. At this time, turning on the transistor T2 which is closer to the source, the potential at the cell plate in the capacitor is fixed at Vcc/2, and no potential difference arise in the capacitor. Thus, electric charge in the capacitor is retained without polarization reversal, and no refresh operation is required.

EXAMPLE 1

The FRAM of the present invention is fabricated in the manner as shown in FIG. 3.

First, an element isolating region of field oxidation film is formed on a silicon substrate 1 to isolate an element forming region, and thereafter, gate electrodes 2 are formed of polysilicon having 3500 to 4000 Å thickness on the element forming region. Then, after a $SiO_2$ film is deposited by CVD, it is etched back to form a gate insulation film 3 covering each of the gate electrodes 2, and thereafter, ions are implanted to form an N-type impurity diffusion region 4 between the gate electrodes 2 on the silicon substrate 1 (FIG. 3(a)).

Figure 3A:
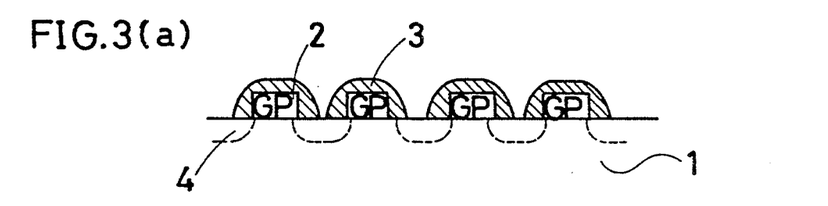
FIGS. 3(a)–3(d) are diagrams for explaining successive stages of manufacturing an embodiment of the present invention.
Figure 3B:
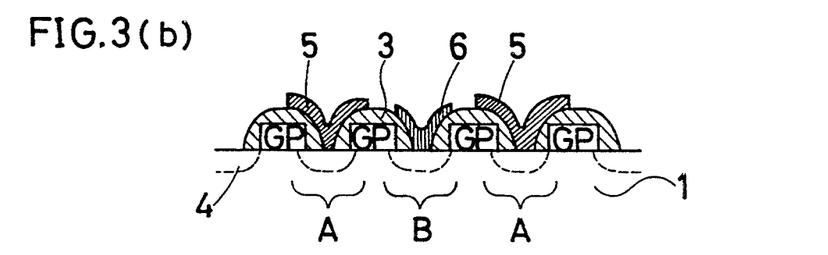

After that, polysilicon is deposited and then patterned to form in a region A between the gate electrodes 2 a polysilicon film 5 serving as a lower electrode of the capacitor and a polysilicon film 6 serving as a bit line contact pad (these may all be a titanium/polysilicon deposited film) (FIG. 3(b)).

Figure 3C:
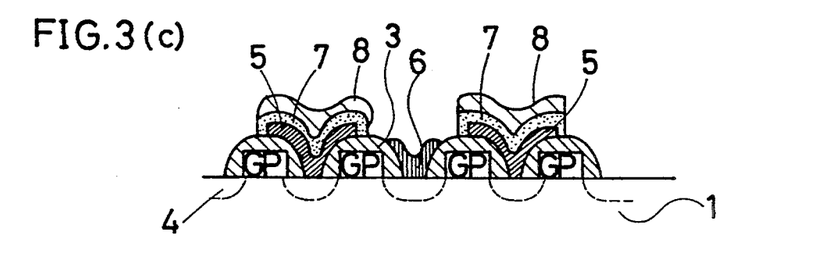

Then, as shown in FIG. 3(c), a PZT film 7 (1000 to 3000 Å thickness) as a ferroelectric film is formed by sputtering on the polysilicon film 5, and further, a platinum film 8 (2000 to 3000 Å thickness) as an upper electrode is formed by the well-known photoetching technology. Other types of ferroelectric film such as a PLZT film may be substituted for the PZT film.

Figure 3D:
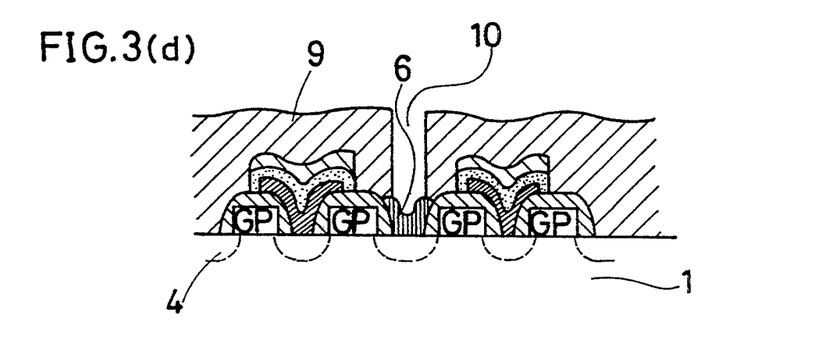

After the entire surface of the polysilicon substrate 1 including the gate electrodes 2 is covered with a $SiO_2$ layer insulating film (6000 to 8000 Å thickness) 9 as shown in FIG. 3(d), a heat treatment (700° C.) is performed for flattening, and an aperture is made in the insulating film 9 in a region B to make a bit contact hole 10 which extends up to the polysilicon film 6.

Figure 4A:
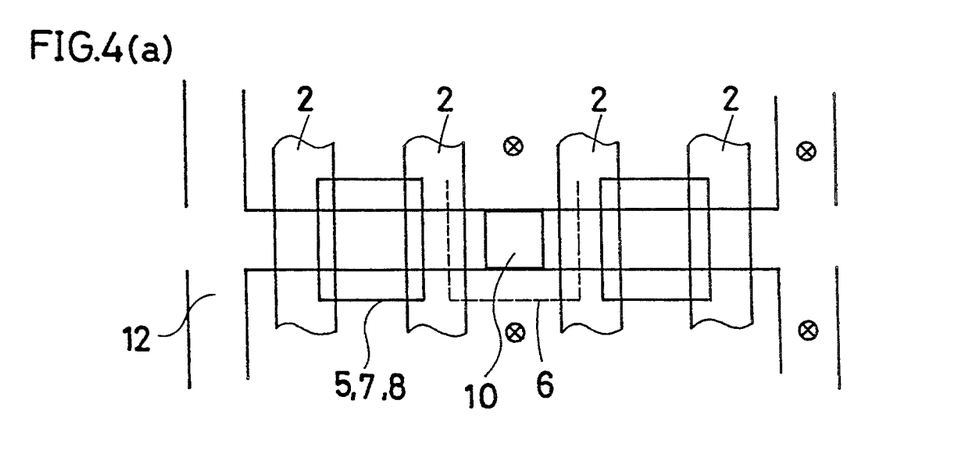
FIGS. 4(a)–4(c) are diagrams for explaining a configuration of two cells of non-volatile RAMs manufactured in accordance with the embodiment.
Figure 4B:
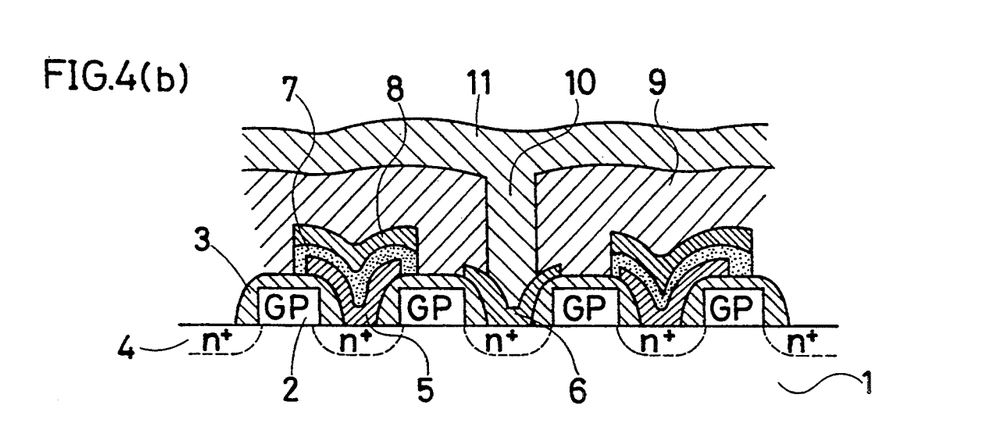
Figure 4C:
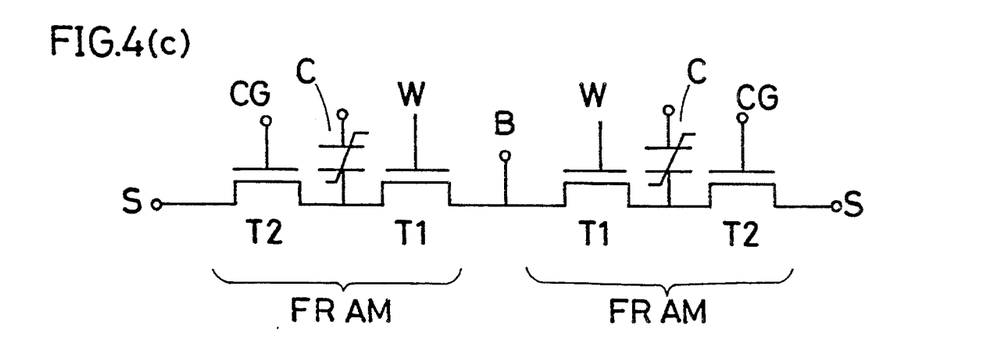

After that, an Al or Al-Si is deposited in 4000 to 5000 Å thickness and then patterned to make a metal wiring layer, and eventually, the intended FRAM of the present invention is obtained as shown in FIG. 4. FIG. 4 includes (a) a layout diagram, (b) a sectional model view, and (c) an equivalent circuit diagram, each of which shows two memory cells in the FRAM. In FIG. 4(b), reference numeral 11 denotes a metal wiring layer and numeral 12 (FIG. 4(a)) denotes an active region, and the total area of the cells is about 3.75 $\mu m^2$ (cell size: about 2.5×1.5 $\mu m$). A scale of integration is equivalent to 16 MDRAM.

In such a FRAM, as mentioned above, writing and reading is non-volatile data, and the wait operation can be performed by controlling voltage in the transistors T1 and T2, and the capacitor C.

EXAMPLE 2

In a manner as shown in FIG. 6, the FRAM of the present invention is fabricated.

Figure 6A:
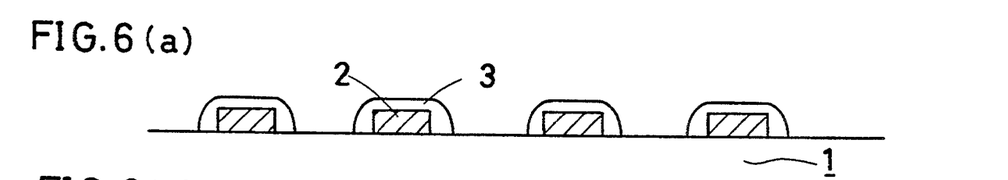
FIGS. 6(a)–6(f) are diagrams for explaining successive stages of manufacturing an another embodiment of the present invention.

First, gate electrodes 2 of polysilicon in 3500 to 4000 Å thickness are formed on a silicon substrate 1, and a $SiO_2$ film is deposited by CVD, it is etched back to form a gate protecting film 3 covering each of the gate electrodes (FIG. 6(a)).

Figure 6B:
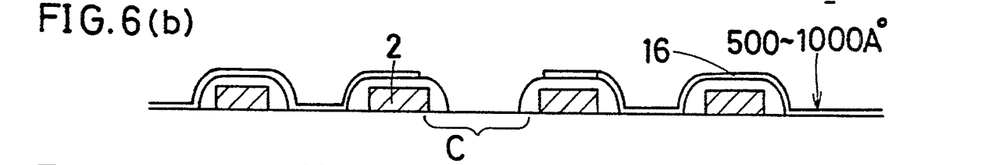

Then, nondoped silicate glass (NSG) film 16 is deposited and patterned to form a bit line contact hole (FIG. 6(b)). At this time, the patterning leaves no NSG film 16 in a region C between the gate electrodes 2.

Figure 6C:
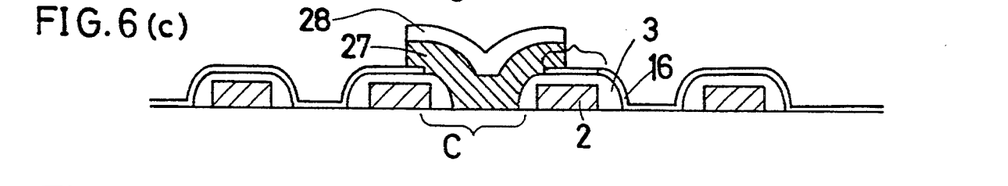

Further, as shown in FIG. 6(c), polysilicon layer 27 (thickness 1000 to 3000 Å) is deposited and is implanted to form an N-type impurity diffusion region (not shown), a $WSi_x$ layer is formed on the polysilicon layer, and then the polysilicon layer and the $WSi_x$ layer are patterned to form a bit line comprising a polysilicon film 27 and a $WSi_x$ film 28 (2000 to 3000 Å thickness).

Figure 6D:
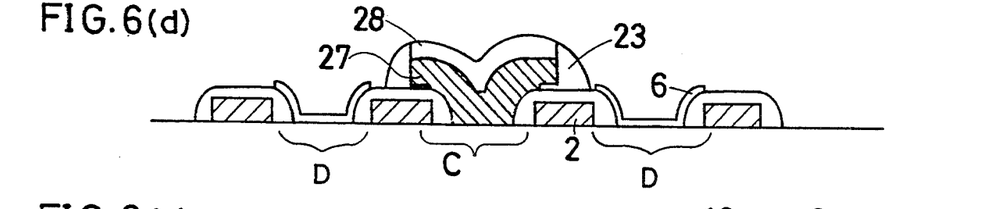

Then, as shown in FIG. 6(d), a side wall 23 is formed in an ordinary way. At this time, side wall material is deposited over the whole surface of the silicon substrate 1 including the gate electrodes 2, and thereafter, the side wall material and NSG film 16 removed by reactive ion etching (RIE) to leave the side wall 23 only on the polysilicon film 27, the $WSi_x$ film 28, and the gate protecting film 3. Next, a contact pad 6 of a capacitor lower electrode consisting of polysilicon is formed in the region D between the gate electrodes.

Figure 6E:
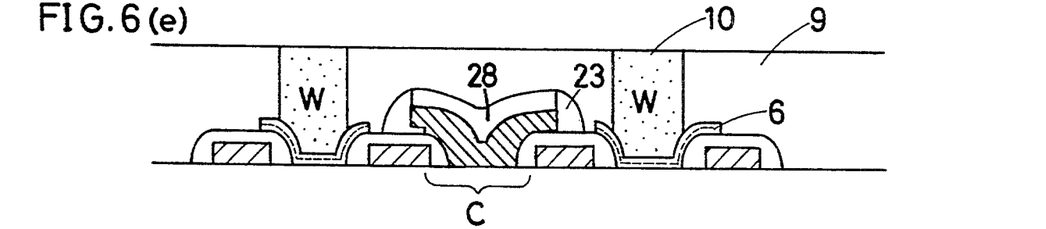

After the whole surface is coated with a $SiO_2$ layer insulating film (6000 to 8000 Å thickness) 9, a heat treatment (700° C.) is carried out for flattening, and an aperture is made in the insulating film 9 at a layer in a region D except for the region C between the gate electrodes 2 to form a bit contact hole 10 of the capacitor lower electrode which extends to the polysilicon film 6.

Figure 6F:
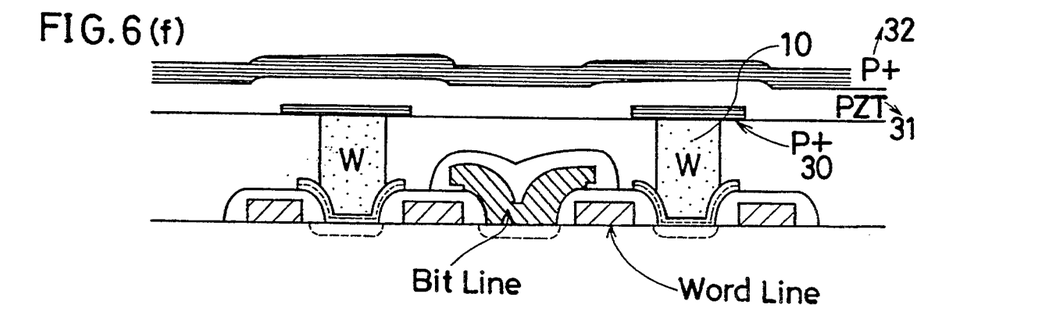

After that, as shown in FIG. 6(f), a platinum film 30 (2000 to 3000 Å thickness) is formed over the bit contact hole 10 to make a lower electrode (accumulation electrode). On the lower electrode 30, a PZT film 31 (1000 to 3000 Å thickness) as ferroelectric film is formed by sputtering.

Figure 7:
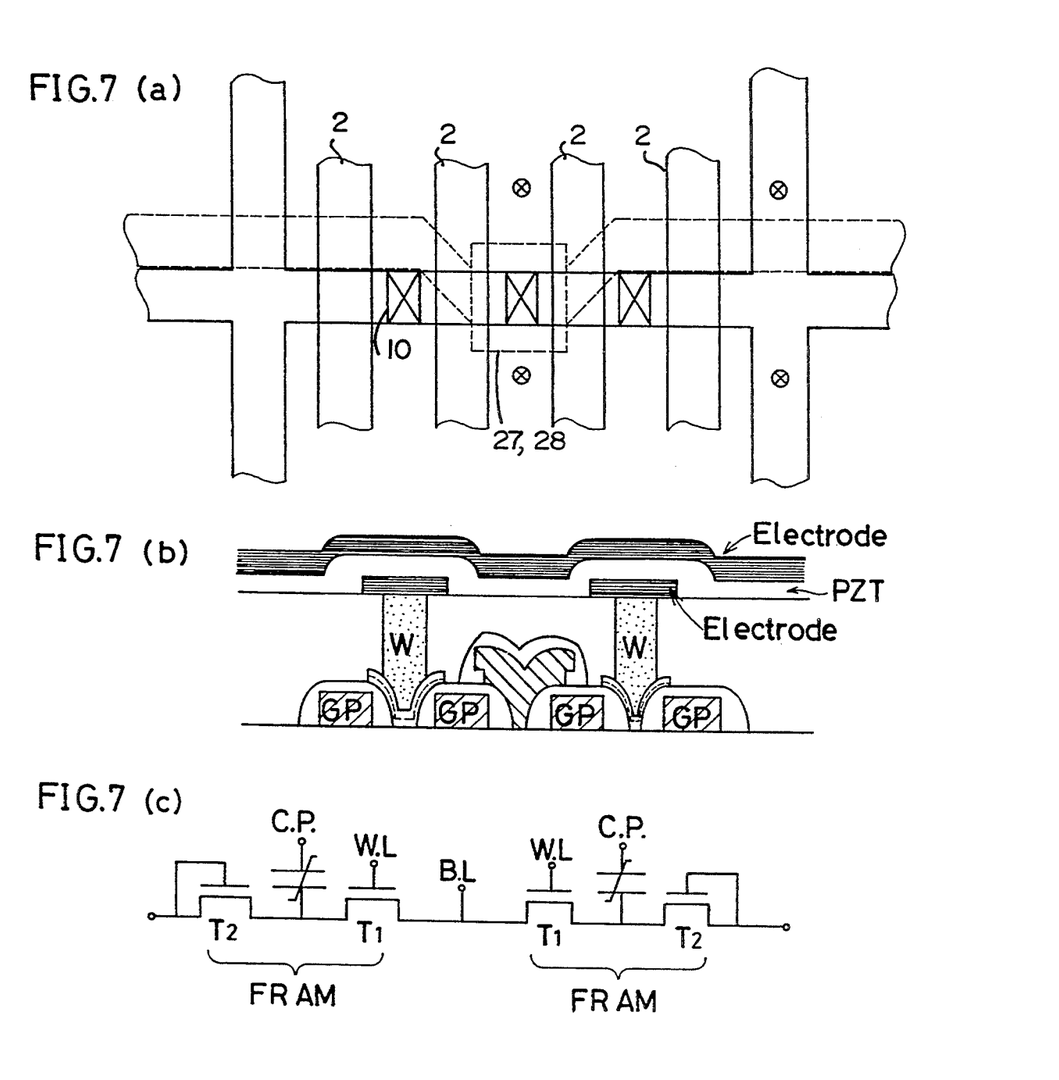
FIGS. 7(a)–7(c) are diagrams for explaining a configuration of two cells of non-volatile RAMs manufactured in accordance with the another embodiment.

Furthermore, a platinum film 32 (2000 to 3000 Å thickness) is formed on the PZT film 31 to make an upper electrode (cell plate). FIG. 7 includes (a) a layout diagram, (b) a sectional model view, and (c) an equivalent circuit diagram, each of which shows two memory cells of the FRAM. The total area of the cells is about 3.68 $\mu m^2$ (cell size: about 2.45×1.5 $\mu m$), and a scale of integration is equivalent to the 16 MDRAM.

In such a FRAM, as mentioned above the writing and reading of non-volatile data, and the wait operation can be performed by controlling voltage at the transistors T1, T2 and the capacitor C.

Thus, in accordance with the present invention, a single FRAM is comprised of two transistors and one capacitor, and therefore, a non-volatile random access memory in higher integration than conventional can be provided.

What is claimed is:

1. A non-volatile random access memory including a plurality of memory cells, each memory cell comprising
a pair of metal oxide semiconductor transistors, said transistors being connected to each other by a common impurity diffusion region, and
a capacitor having a ferroelectric film acting as a capacitor dielectric layer, a first electrode of said capacitor being connected to said common impurity diffusion region and a second electrode; and in which
one of said pair of metal oxide semiconductor transistors is connected to a bit line and a word line; and
electric potentials of said second electrode of the capacitor and an impurity diffusion region provided at the opposite side to said common impurity diffusion region with respect to another of the pair of metal oxide semiconductor transistors are fixed at all times to an intermediate voltage between those available for representing data "1" and "0" and said another of the pair of metal oxide semiconductor transistors is non-conducting when writing or reading data to or from the non-volatile random access memory.

2. A memory according to claim 1, said ferroelectric film is a lead zirconate titanate film.

* * * * *